United States Patent
Wang et al.

(10) Patent No.: US 9,635,772 B1
(45) Date of Patent: Apr. 25, 2017

(54) MOUNTING APPARATUS FOR POWER SUPPLY UNIT

(71) Applicant: HON HAI PRECISION INDUSTRY CO., LTD., New Taipei (TW)

(72) Inventors: Peng-Kuei Wang, New Taipei (TW); Tung-Ho Shih, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/969,770

(22) Filed: Dec. 15, 2015

(30) Foreign Application Priority Data

Nov. 18, 2015 (CN) .......................... 2015 1 0793166

(51) Int. Cl.
| | | |
|---|---|---|
| *H01R 13/62* | (2006.01) | |
| *H05K 5/02* | (2006.01) | |
| *H05K 7/14* | (2006.01) | |

(52) U.S. Cl.
CPC ......... *H05K 5/0221* (2013.01); *H05K 7/1492* (2013.01)

(58) Field of Classification Search
CPC .................... H05K 5/0221; H05K 7/1492
USPC ................... 248/316.7; 361/679.58, 679.57; 439/372, 373, 299, 374
See application file for complete search history.

(56) References Cited

U.S. PATENT DOCUMENTS

| | | | | |
|---|---|---|---|---|
| 2,432,120 A | * | 12/1947 | Neill ..................... | H01R 13/633 244/136 |
| 2,609,268 A | * | 9/1952 | Nye ..................... | H01M 2/1083 100/213 |
| 3,017,598 A | * | 1/1962 | Low ..................... | H01R 13/62 248/316.1 |
| 4,204,738 A | * | 5/1980 | Tillotson ............ | H01R 13/6392 439/369 |
| 4,588,238 A | * | 5/1986 | Mickelson ............. | H04Q 1/028 379/413.04 |
| 4,643,503 A | * | 2/1987 | Johnson ................ | H01R 33/97 439/227 |
| 4,702,709 A | * | 10/1987 | Santilli .............. | H01R 13/6395 174/67 |
| 5,174,781 A | * | 12/1992 | Muzslay ............ | H01R 13/6395 439/370 |
| 5,256,085 A | * | 10/1993 | Tan ...................... | H01R 12/716 439/372 |
| 5,348,495 A | * | 9/1994 | Kasden ............. | H01R 13/6395 439/371 |
| 5,593,313 A | * | 1/1997 | Shibuya ............. | H01R 13/6395 439/372 |
| 5,860,827 A | * | 1/1999 | Lee .................... | H01R 13/6395 439/372 |

(Continued)

*Primary Examiner* — Kimberly Wood
(74) *Attorney, Agent, or Firm* — Steven Reiss

(57) ABSTRACT

A mounting apparatus configured to mount a power supply unit to an electronic device includes a case and a locking member. The case includes a side wall and a division plate. A receiving space is defined between the side wall and the division plate. The receiving space receives the power supply unit. The division plate defines a locking hole. The locking member is pivotally mounted on the side wall. The locking member includes a pressing pole and a locking tab. The locking member is rotated on the side wall to have the pressing pole press a power supply unit and the locking tab positioned in the locking hole.

8 Claims, 5 Drawing Sheets

(56) References Cited

U.S. PATENT DOCUMENTS

| | | | | |
|---|---|---|---|---|
| 5,924,886 A * | 7/1999 | Achammer | ............ | H01R 12/67 439/372 |
| 6,176,728 B1 * | 1/2001 | Bonnet | ................... | G06F 1/184 361/800 |
| 6,439,918 B1 * | 8/2002 | Togami | ................ | G02B 6/4246 439/157 |
| 6,739,896 B2 * | 5/2004 | Sivertsen | ........... | H01R 13/6395 174/135 |
| 6,767,237 B1 * | 7/2004 | Shih | ................... | H01R 13/6392 439/371 |
| 7,101,215 B2 * | 9/2006 | Woellner | ............. | H01R 13/639 439/371 |
| 7,513,791 B1 * | 4/2009 | Gary | ................. | H01R 13/6395 439/373 |
| 7,524,205 B1 * | 4/2009 | Lee | ................... | H01R 13/6392 439/350 |
| 7,695,305 B1 * | 4/2010 | Ray | ................... | H01R 13/6395 439/359 |
| 7,850,478 B2 * | 12/2010 | Lin | ................... | H01R 13/6395 439/372 |
| 7,938,671 B2 * | 5/2011 | Hayden, Sr. | ........ | H01R 13/6395 439/371 |
| 8,248,820 B2 * | 8/2012 | Wu | ...................... | H05K 7/1492 361/730 |
| 8,496,497 B2 * | 7/2013 | Fu | ...................... | H01R 13/6395 439/372 |
| 8,777,655 B2 * | 7/2014 | Blanton | ............. | H01R 13/6392 439/372 |

\* cited by examiner

MOUNTING APPARATUS FOR POWER SUPPLY UNIT

CROSS-REFERENCE TO RELATED APPLICATION

This application claims priority to Chinese Patent Application No. 201510793166.8 filed on Nov. 18, 2015, the contents of which are incorporated by reference herein.

FIELD

The subject matter herein generally relates to an mounting apparatus for electronic device, and in particular to an mounting apparatus for mounting a power supply unit.

BACKGROUND

In servers, power supply units are mounted in a case by a plurality of screws. However, it is time-consuming to mount the plurality of screws on the case or detach the plurality of screws from the case with a screwdriver.

BRIEF DESCRIPTION OF THE DRAWINGS

Implementations of the present technology will now be described, by way of example only, with reference to the attached figures.

DETAILED DESCRIPTION

Figure 1:
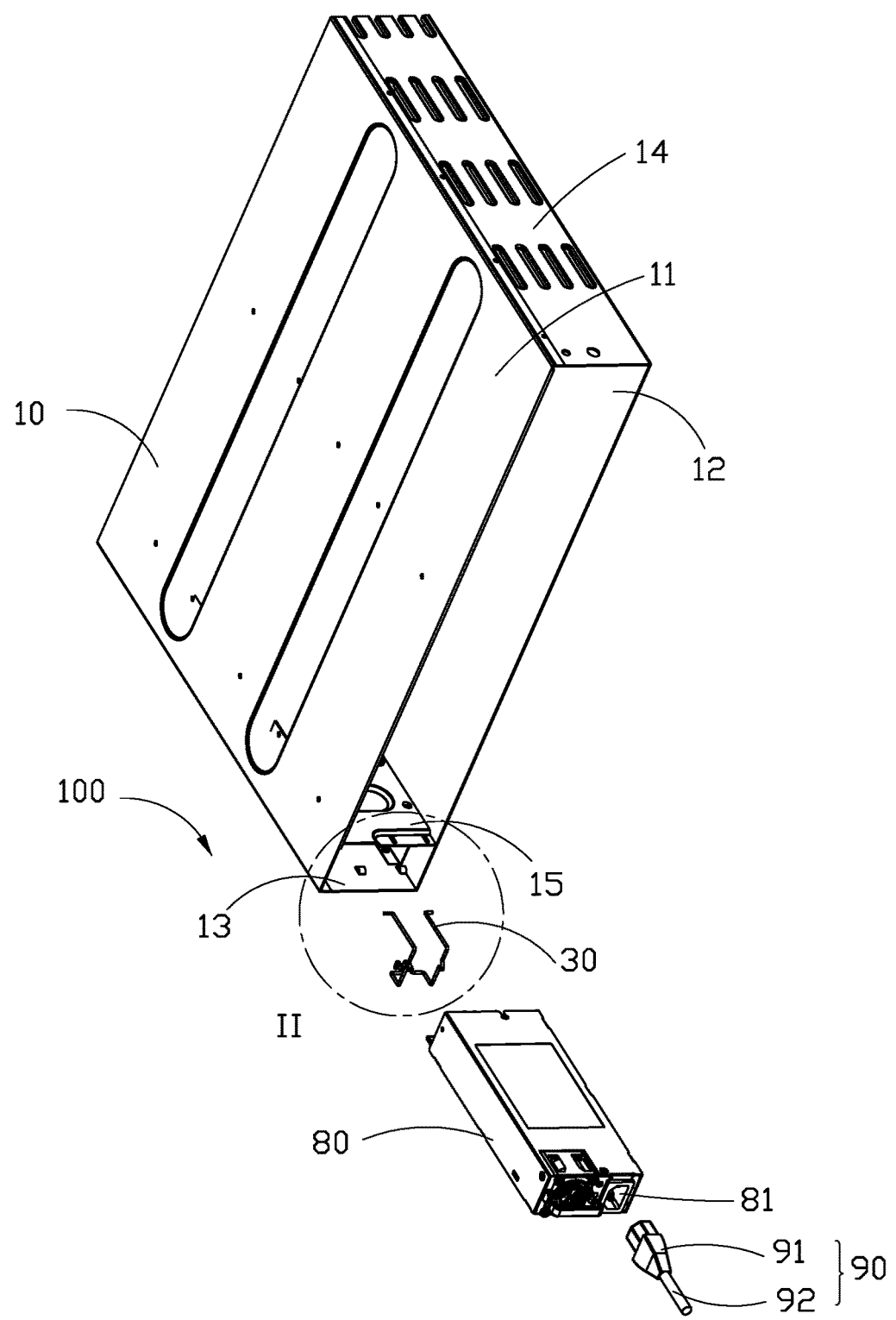
FIG. 1 is an exploded, isometric view of one embodiment of a mounting apparatus and a power supply unit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

FIG. 1 illustrates a mounting apparatus 100 for mounting a power supply unit 80. The mounting apparatus 100 comprises a case 10 and a locking member 30. A power plug 90 can be inserted in a port 81 of the power supply unit 80 to provide power to the power supply unit 80. The power plug 90 comprises a plug 91 and a cord 92 connected to the plug 91.

The case 10 includes a top wall 11, a bottom wall 12, a first side wall 13, and a second side wall 14. The top wall 11 is parallel to the bottom wall 12. The first side wall 13 is parallel to the second side wall 14. The first side wall 13 and the second side wall 14 are perpendicularly connected between the top wall 11 and the bottom wall 12. A division plate 15 is also connected between the top wall 11 and the bottom wall 12. The division plate 15 is located between the first side wall 13 and the second side wall 14. A receiving space 16 is defined among the division plate 15, the first side wall 13, the top wall 11, and the bottom wall 12.

Figure 2:
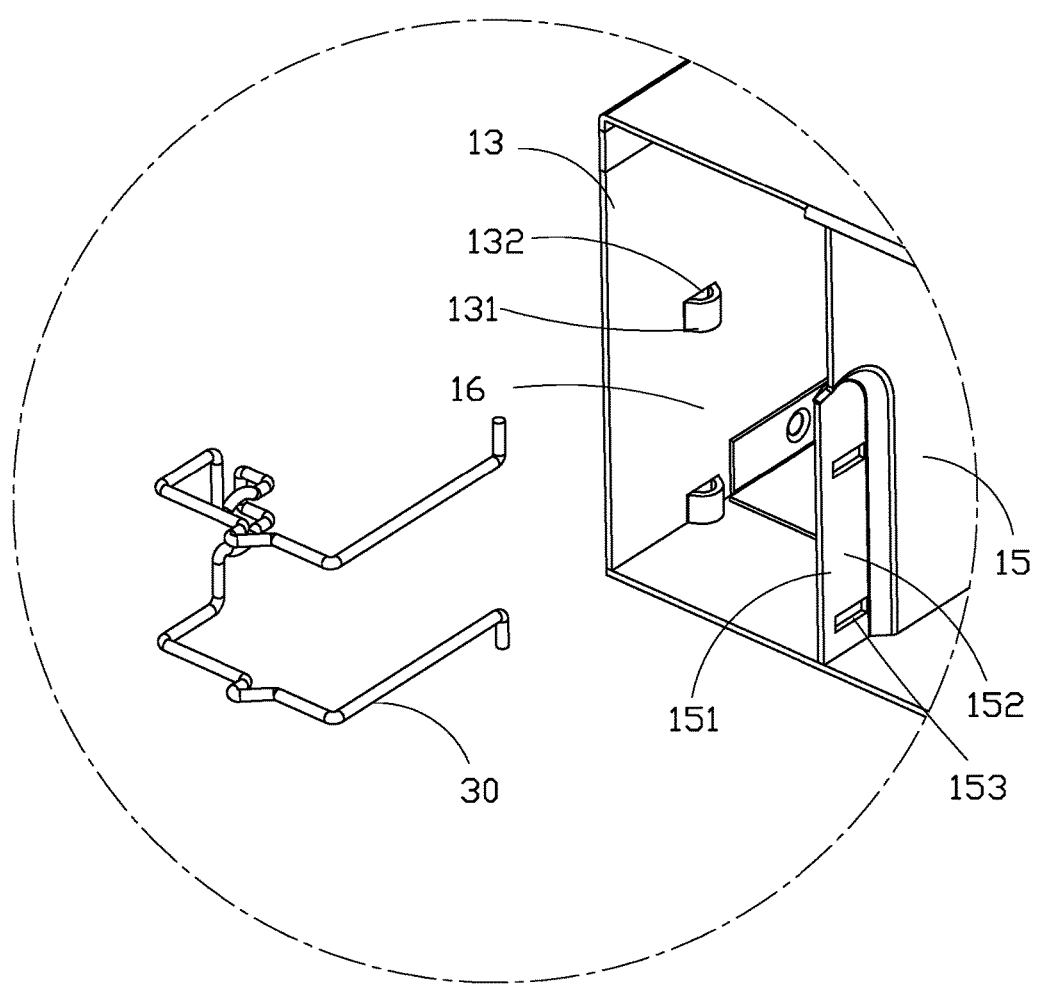
FIG. 2 is an enlarged view of the portion II of FIG. 1.

FIG. 2 illustrates that a pair of restricting pieces 131 are formed on the first side wall 13 and located in the receiving space 16. The restricting piece 131 is vaulted to define a pivoting hole 132 between the restricting piece 131 and the first side wall 13. An edge portion of the division plate 15 is recessed towards to the first side wall 13 to form a locking portion 151. A recess room 152 is defined on the locking portion 151. The locking portion 151 defines two locking holes 153.

Figure 3:
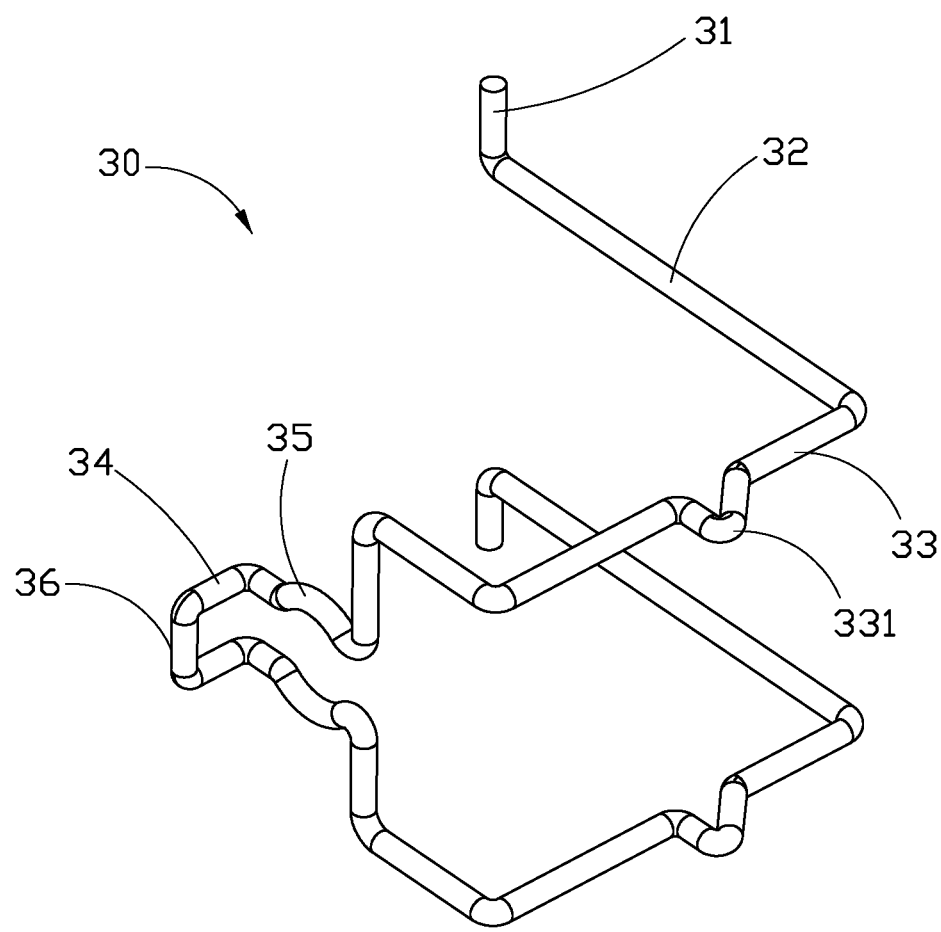
FIG. 3 is an isometric view of a locking member of FIG. 1.

FIGS. 2 and 3 illustrate that the locking member 30 is a bent rod which can be elastically deformed. The locking member 30 comprises two pivoting ends 31. Each pivoting end 31 is perpendicularly connected to a pressing pole 32. Each pressing pole 32 is perpendicularly connected to a locking pole 33. A locking tab 331 is protruded from a center portion of the locking pole 33. A cord securing portion 34 is connected between two locking poles 33. The cord securing portion 34 comprises two clamping portions 35. Each clamping portion 35 is formed in an arc. The two clamping portions 35 can be elastically deformed. A handle 36 is connected between the two clamping portions 35.

Figure 4:
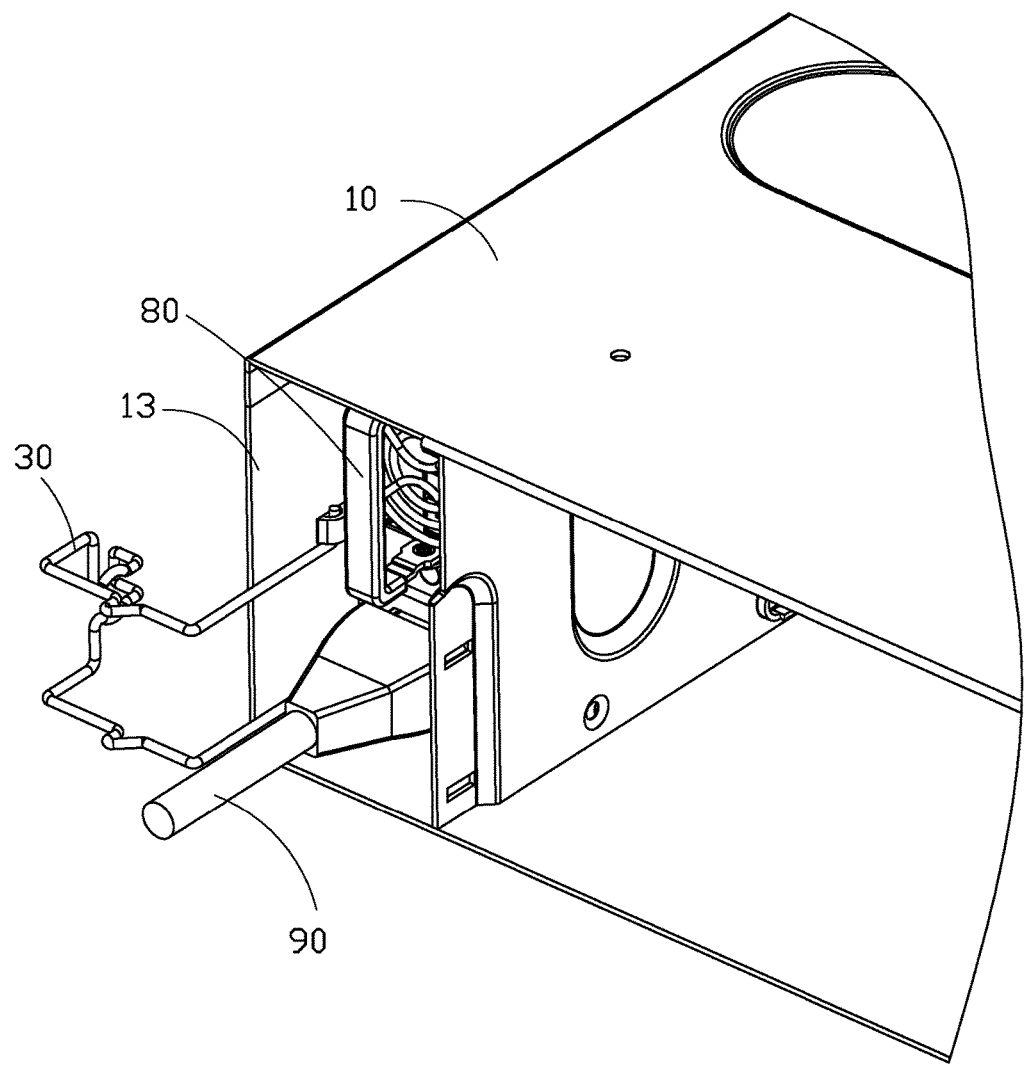
FIG. 4 is an assembled, isometric view of the mounting apparatus and the power supply unit of FIG. 1.
Figure 5:
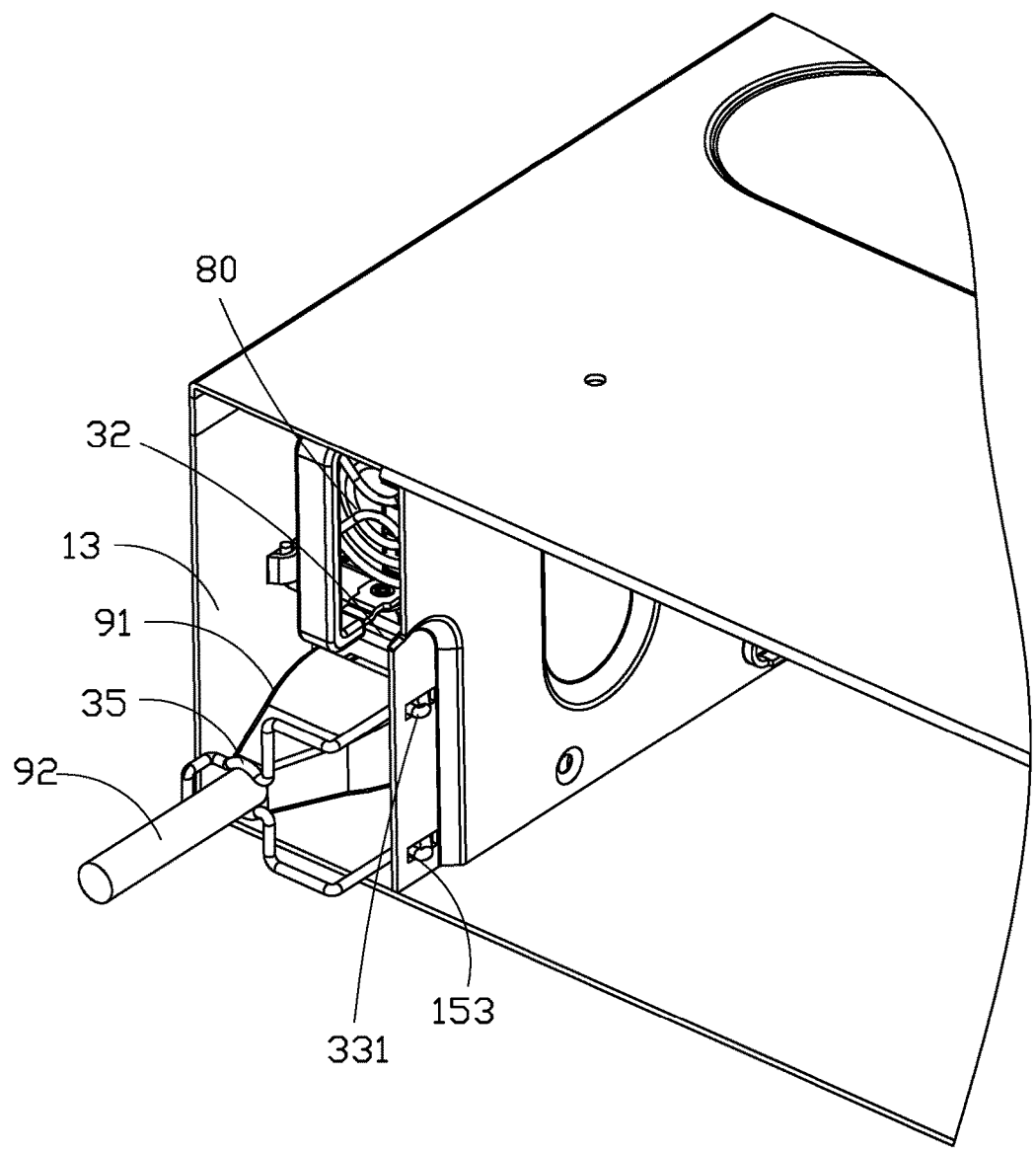
FIG. 5 is another assembled, isometric view of the mounting apparatus and the power supply unit of FIG. 1.

FIGS. 4 and 5 illustrate when in assembly, the two pivoting ends 31 of the locking member 30 are pivotally mounted in the pivoting holes 132 of the first side wall 13. The power supply unit 80 is placed in the receiving space 16 of the case 10. The plug 91 of the power plug 90 is inserted in the port 81 of the power supply unit. Then, the locking member 30 is rotated until the two pressing poles 32 press the power supply unit 80. The cord 92 of the power plug 90 is slid between the two clamping portions 35 of the locking member 30. The two clamping portions 35 are elastically deformed to sandwich the cord 92. Simultaneously, the two clamping portions 35 resist against the plug 91. The locking tabs 331 of the locking member 30 resist against the locking portion 151 of the division plate 15 to elastically deform the locking poles 33. The locking member 30 continues to rotate until the locking tabs 331 are aligned with the locking holes 153. The locking poles 33 recover to position the locking tabs 331 in the locking holes 153. Thereby, the locking member 30 is mounted on the case 10 pressing the power supply unit 80 and clamping the cord 92. The two clamping portions 35 resist against the plug 91 to prevent the plug 91 from being pulled out from the port 81. Because the locking portion 151 has a recess room 152 to receive the locking tabs 331, the locking tabs 331 do not disturb other components.

When needing to detach the power supply unit 80 or to pull out the plug 91 from the port 81 of the power supply unit 80, the handle 36 is pulled to elastically deform the locking poles 33 to have the locking tabs 331 escape from the locking holes 153. The locking member 30 rotates backwards to release the power supply unit 80 and the power plug 90. Therefore, the power supply unit 80 can be detached from the case 10 and the plug 91 can be pulled out form the port 81 of the power supply unit 80.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to, and including, the full extent established by the broad general meaning of the terms used in the claims. It will therefore be appreciated that the embodiments described above may be modified within the scope of the claims.

What is claimed is:

1. A mounting apparatus configured to mount a power supply unit to an electronic device, the mounting apparatus comprising:
    a case comprising a side wall and a division plate, the side wall and the division plate defining a receiving space configured to receive the power supply unit therein, an edge portion of the division plate sunk towards to the side wall to form a locking portion, the locking portion defining a locking hole, a recess room defined on the locking portion; and
    a locking member pivotally mounted on the side wall and comprising a locking tab;
    wherein the locking member is configured to rotate on the side wall to press the power supply unit and the locking tab positioned in the locking hole and received in the recess room.

2. The mounting apparatus of claim 1, wherein the locking member is a bend rod which can be elastically deformed.

3. The mounting apparatus of claim 1, wherein the locking member comprises a pivoting end, the side wall defines a pivoting hole, and the pivoting end is pivotally mounted in the pivoting hole.

4. The mounting apparatus of claim 3, wherein the pivoting end is connected to a pressing pole, and the pressing pole is configured to press the power supply unit when the locking tab is positioned in the locking hole.

5. The mounting apparatus of claim 4, wherein the pressing pole is connected to a locking pole, and a center portion of the locking pole is protruded to form the locking tab.

6. The mounting apparatus of claim 5, wherein a cord securing portion is connected to the locking pole, the cord securing portion comprise two clamping portions which are configured to clamp a cord of a power plug.

7. The mounting apparatus of claim 6, wherein the clamping portions are formed in arcs to satisfy the cord of the power plug.

8. The mounting apparatus of claim 6, wherein a handle is connected between the two clamping portions, and the handle is configured to be pulled to elastically deform the locking pole to remove the locking tab out of the locking hole.

* * * * *